United States Patent
Chen et al.

(10) Patent No.: US 10,903,328 B2
(45) Date of Patent: Jan. 26, 2021

(54) METHOD FOR FABRICATING SEMICONDUCTOR DEVICE

(71) Applicants: UNITED MICROELECTRONICS CORP., Hsin-Chu (TW); Fujian Jinhua Integrated Circuit Co., Ltd., Quanzhou (CN)

(72) Inventors: Po-Chun Chen, Tainan (TW);
Chia-Lung Chang, Tainan (TW);
Yi-Wei Chen, Taichung (TW);
Wei-Hsin Liu, Changhua County (TW);
Han-Yung Tsai, Tainan (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 106 days.

(21) Appl. No.: 15/943,717

(22) Filed: Apr. 3, 2018

(65) Prior Publication Data
US 2019/0280095 A1  Sep. 12, 2019

(30) Foreign Application Priority Data

Mar. 8, 2018 (CN) .......................... 2018 1 0189348

(51) Int. Cl.
*H01L 29/423* (2006.01)
*H01L 21/28* (2006.01)
*H01L 27/108* (2006.01)
*H01L 21/762* (2006.01)

(52) U.S. Cl.
CPC .... *H01L 29/4236* (2013.01); *H01L 21/28088* (2013.01); *H01L 21/28229* (2013.01); *H01L 21/76224* (2013.01); *H01L 27/10876* (2013.01)

(58) Field of Classification Search
None
See application file for complete search history.

(56) References Cited

U.S. PATENT DOCUMENTS

| | | | | |
|---|---|---|---|---|
| 6,020,230 A * | 2/2000 | Wu | ............... | H01L 21/76227 257/E21.547 |
| 6,137,152 A * | 10/2000 | Wu | ............... | H01L 21/76227 257/506 |
| 6,214,696 B1 * | 4/2001 | Wu | ............... | H01L 21/76227 257/E21.547 |
| 6,309,924 B1 * | 10/2001 | Divakaruni | ....... | H01L 27/10861 257/E21.651 |

(Continued)

FOREIGN PATENT DOCUMENTS

| CN | 101996950 A | 3/2011 |
|---|---|---|
| CN | 106920770 A | 7/2017 |

OTHER PUBLICATIONS

Lu, Title of Invention: Semiconductor Device and Fabrication Method Thereof, U.S. Appl. No. 15/672,272, filed Aug. 8, 2017.

*Primary Examiner* — Erik T. K. Peterson
(74) *Attorney, Agent, or Firm* — Winston Hsu

(57) ABSTRACT

A method for fabricating semiconductor device includes the steps of: forming a shallow trench isolation (STI) in the substrate; removing part of the STI to form a trench in a substrate; forming an amorphous silicon layer in the trench and on the STI; performing an oxidation process to transform the amorphous silicon layer into a silicon dioxide layer; and forming a barrier layer and a conductive layer in the trench.

4 Claims, 3 Drawing Sheets

(56) References Cited

U.S. PATENT DOCUMENTS

| | | | | |
|---|---|---|---|---|
| 6,391,784 B1* | 5/2002 | Ibok | ............... | H01L 21/76224 |
| | | | | 257/E21.268 |
| 8,772,105 B2 | 7/2014 | Jang et al. | | |
| 9,064,692 B2 | 6/2015 | Srivastava et al. | | |
| 2002/0127818 A1* | 9/2002 | Lee | ............... | H01L 21/76224 |
| | | | | 438/424 |
| 2003/0040189 A1* | 2/2003 | Chang | ............... | H01L 21/76224 |
| | | | | 438/700 |
| 2005/0186755 A1* | 8/2005 | Smythe, III | ...... | H01L 21/76224 |
| | | | | 438/424 |
| 2006/0125043 A1* | 6/2006 | Smythe, III | ...... | H01L 21/76224 |
| | | | | 257/506 |
| 2008/0150015 A1* | 6/2008 | Cho | ............... | H01L 29/7813 |
| | | | | 257/330 |
| 2009/0209090 A1* | 8/2009 | Yokoyama | ......... | H01L 29/6606 |
| | | | | 438/476 |
| 2013/0221428 A1* | 8/2013 | Venkatraman | ...... | H01L 29/7827 |
| | | | | 257/330 |
| 2014/0162431 A1* | 6/2014 | Lin | ............... | H01L 21/02164 |
| | | | | 438/435 |
| 2015/0064929 A1* | 3/2015 | Tseng | ............... | H01L 21/762 |
| | | | | 438/762 |
| 2015/0371991 A1* | 12/2015 | Nobuto | ............ | H01L 27/10823 |
| | | | | 257/330 |
| 2017/0186642 A1* | 6/2017 | Kim | ............... | H01L 21/76229 |

* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a shallow trench isolation (STI) in the substrate; removing part of the STI to form a trench in a substrate; forming an amorphous silicon layer in the trench and on the STI; performing an oxidation process to transform the amorphous silicon layer into a silicon dioxide layer; and forming a barrier layer and a conductive layer in the trench.

According to an embodiment of the present invention, the oxidation process includes an in-situ steam generation (ISSG) process, a thickness of the amorphous silicon layer is between 5 Angstroms to 30 Angstroms, and the barrier layer comprises TiN.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
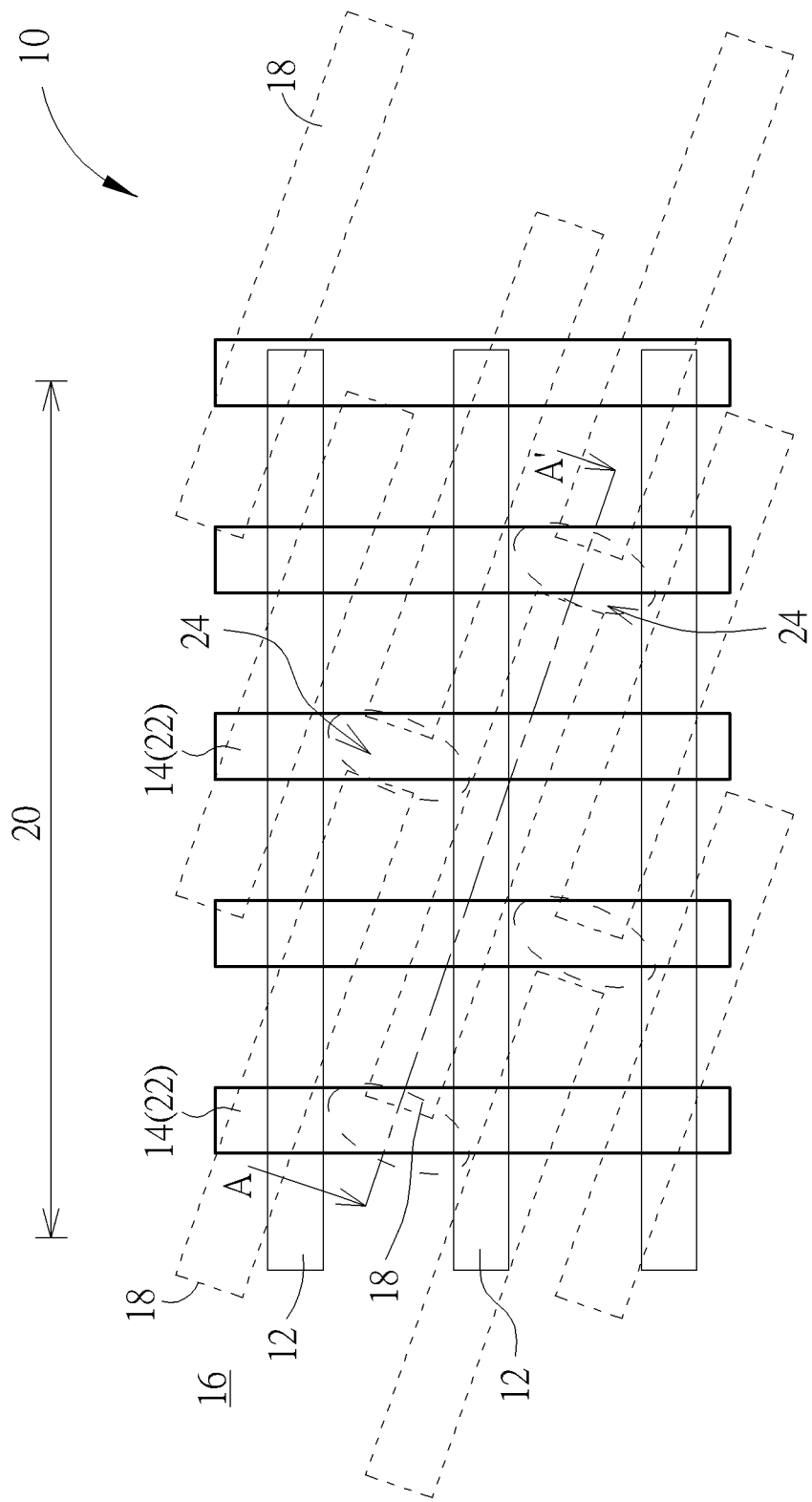
FIG. 1 illustrates a top view of a DRAM device according to an embodiment of the present invention.
Figure 2:
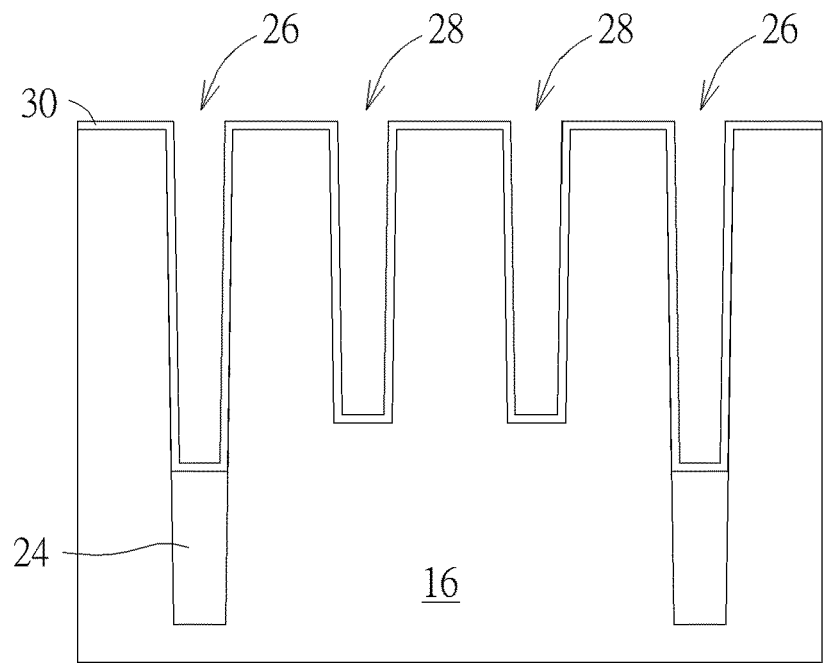
FIGS. 2-4 are cross-sectional views illustrating steps of fabricating the DRAM device of FIG. 1 along the sectional line AA'.
Figure 3:
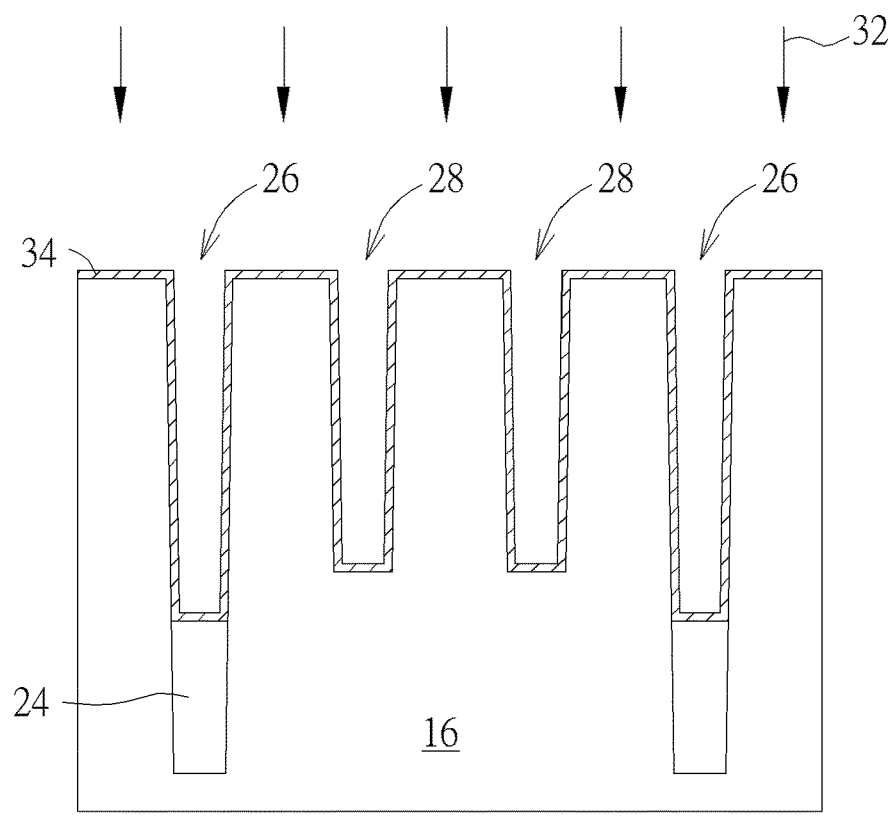
Figure 4:
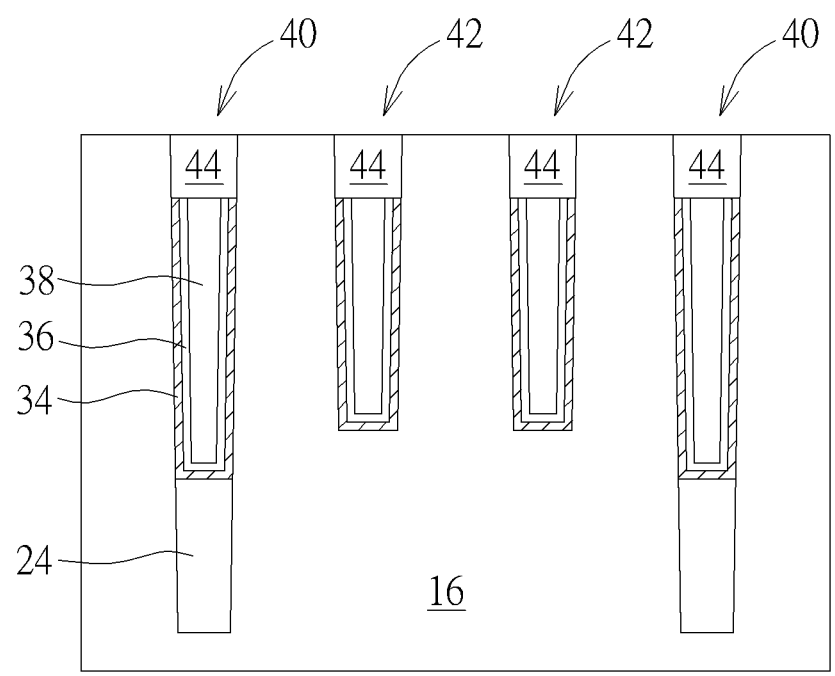

Referring to FIGS. 1-4, FIGS. 1-4 illustrate a method for fabricating a DRAM device according to an embodiment of the present invention, in which FIG. 1 illustrates a top-view diagram and FIGS. 2-4 are cross-sectional views illustrating steps of fabricating the DRAM device of FIG. 1 along the sectional line AA'. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STIs 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

The fabrication of word lines 14 (or also referred to as buried word lines, BWL) is explained below. As shown in FIG. 2, first trenches 26 and second trenches 28 are formed in the substrate 16 and shallow trench isolations (STIs) 24 are disposed on the bottom of the first trenches 26, in which the top surface of the STIs 24 is slightly lower than the bottom surface of the second trenches 28. In this embodiment, the formation of the first trenches 26, the second trenches 28, and the STIs 24 could be accomplished by first removing part of the substrate 16 and then forming STIs 24 made of silicon oxide in the substrate 16 such that the top surface of the STIs 24 is even with the top surface of the substrate 16. Next, an etching process is conducted to remove part of the STI 24 as well part of the substrate 16 adjacent to the STI 24 to form trenches, in which the trenches directly on top of the remaining STIs 24 become first trenches 26 while the trenches formed by removing part of the substrate 16 adjacent to the STIs 24 become the second trenches 28.

Next, an atomic layer deposition (ALD) process or a chemical vapor deposition (CVD) process is conducted to form an amorphous silicon layer 30 in each of the trenches and on the surface of the substrate 16. In this embodiment, the amorphous silicon layer 30 is deposited into the first trenches 26 and the second trenches 28 without filling each of the trenches 26, 28 completely, in which the amorphous silicon layer 30 in the first trenches 26 is deposited on the sidewalls of the first trenches 26 and the top surface of the STI 24 and the amorphous silicon layer 30 in the second trenches 28 is deposited on the sidewalls and bottom of the second trenches 28. Preferably, the thickness of the amorphous silicon layer 30 formed in each of the first trenches 26 and second trenches 28 is between 5 Angstroms to 30 Angstroms or most preferably at around 15 Angstroms.

Next, as shown in FIG. 3, an oxidation process or more specifically an in-situ steam generation (ISSG) process 32 is conducted to transform the amorphous silicon layer 30 into a silicon dioxide layer 34, which will be serving as a gate dielectric layer for gate structures in the later process. Specifically, oxygen gas is injected during the ISSG process 32 so that the injected oxygen gas would react with the amorphous silicon layer 30 to form the silicon dioxide layer 34 preferably without reacting with any of the substrate 16 made from silicon and the newly formed silicon dioxide layer 30 then replaces the place of the original amorphous silicon layer 30. In other words, the present invention preferably controls the volume and/or flow of the oxygen gas being injected so that all of the amorphous silicon layer 30 would react with the oxygen gas to form the silicon dioxide layer 34 as none of substrate 16 is consumed. By doing so, all of the amorphous silicon layer 30 would be consumed or none of the amorphous silicon layer 30 would remain after the amorphous silicon layer 30 is transformed into silicon dioxide layer 34 and the newly formed silicon dioxide layer 34 while replacing the original amorphous silicon layer 30, would share equal thickness as the original amorphous silicon layer 30. In other words, the thickness of the newly formed silicon dioxide layer 34 is preferably between 5 Angstroms to 30 Angstroms or most preferably at around 15 Angstroms.

It should be noted that even though the substrate 16 is preferably not consumed while the amorphous silicon layer 30 is transformed into silicon dioxide layer 34 during the ISSG process 32, according to an embodiment of the present invention, it would also be desirable to react a small portion of the substrate 16 with oxygen gas to form silicon dioxide for building up the thickness of the silicon dioxide layer 34 slightly after all of the amorphous silicon layer 30 is transformed into the silicon dioxide layer 34. By following this approach, the overall thickness of the silicon dioxide layer 34 would be slightly greater than thickness of the original silicon dioxide layer preferably by an increase between 5% to 10%.

Next, as shown in FIG. 4, a barrier layer 36 and a conductive layer 38 are sequentially formed on the silicon dioxide layer 34, and an etching back process is conducted to remove part of the conductive layer 38 and part of the barrier layer 36 so that the top surface of the remaining conductive layer 38 and barrier layer 36 is slightly lower than the top surface of the substrate 16. This forms first gate structures 40 in the first trenches 26 and second gate structures 42 in the second trenches 28, in which the first gate structures 40 and second gate structures 42 essentially become the bit lines 12 shown in FIG. 1. Next, a hard mask 44 is formed on each of the first gate structures 40 and second gate structures 42, in which the top surface of the hard mask 44 is even with the top surface of the substrate 16.

In this embodiment, the barrier layer 36 preferably includes a work function metal layer which could be a n-type work function metal layer or p-type work function metal layer depending on the demand of the process or product. In this embodiment, n-type work function metal layer could include work function metal layer having a work function ranging between 3.9 eV and 4.3 eV such as but not limited to for example titanium aluminide (TiAl), zirconium aluminide (ZrAl), tungsten aluminide (WAl), tantalum aluminide (TaAl), hafnium aluminide (HfAl), or titanium aluminum carbide (TiAlC), but not limited thereto. P-type work function metal layer on the other hand could include work function metal layer having a work function ranging between 4.8 eV and 5.2 eV such as but not limited to for example titanium nitride (TiN), tantalum nitride (TaN), or tantalum carbide (TaC), but not limited thereto. The conductive layer 38 could be made of low resistance material including but not limited to for example Cu, Al, W, TiAl, CoWP, or combination thereof and the hard mask 44 is preferably made of dielectric material such as silicon nitride.

Next, an ion implantation process could be conducted depending on the demand of the process to form a doped region (not shown) such as lightly doped drain or source/drain region in the substrate 16 adjacent to two sides of the first gate structure 40 or second gate structure 42. Next, a contact plug process could be conducted to form word line contacts adjacent to two sides of the second gate structures 42 electrically connecting the source/drain region and bit lines formed thereafter and storage node contacts electrically connecting the source/drain region and capacitors fabricated in the later process.

Overall, the present invention first forms an amorphous silicon layer in trenches in the substrate during the fabrication of word lines of a DRAM device, conducts an ISSG process to transform the amorphous silicon layer into silicon dioxide layer, and then deposits a barrier layer and a conductive layer into the trenches to form gates or buried word line structures. Since the present invention replaces the conventional approach of using ALD process to form silicon dioxide layer directly into the trenches with an approach of first depositing an amorphous silicon layer into the trenches and then transforming the amorphous silicon layer by ISSG process into silicon dioxide layer afterwards, it would be desirable for the oxygen gas injected from the ISSG process to react with the amorphous silicon layer instead of the silicon substrate to form silicon dioxide so that over consumption of the substrate could be prevented. By doing so, the overall strength of the silicon dioxide layer could be increased and control of the pitches could be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a shallow trench isolation (STI) in a substrate;
   removing part of the STI to form a trench;
   forming an amorphous silicon layer in the trench and on the STI and contacting a surface of the substrate directly;
   performing an in-situ steam generation (ISSG) process to transform the amorphous silicon layer contacting the surface of the substrate into a silicon dioxide layer on the STI; and
   forming a barrier layer in the trench.

2. The method of claim 1, further comprising forming a conductive layer in the trench after forming the barrier layer to form a gate structure.

3. The method of claim 1, wherein a thickness of the amorphous silicon layer is between 5 Angstroms to 30 Angstroms.

4. The method of claim 1, wherein the barrier layer comprises TiN.

* * * * *